United States Patent
Mikami et al.

(10) Patent No.: US 8,580,465 B2
(45) Date of Patent: Nov. 12, 2013

(54) MULTILAYER MIRROR FOR EUV LITHOGRAPHY AND PROCESS FOR ITS PRODUCTION

(75) Inventors: Masaki Mikami, Tokyo (JP); Mitsuhiko Komakine, Tokyo (JP); Yoshiaki Ikuta, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 16 days.

(21) Appl. No.: 13/443,108

(22) Filed: Apr. 10, 2012

(65) Prior Publication Data

US 2012/0196208 A1   Aug. 2, 2012

Related U.S. Application Data

(63) Continuation of application No. PCT/JP2010/072169, filed on Dec. 9, 2010.

(30) Foreign Application Priority Data

| Dec. 9, 2009 | (JP) | 2009-279371 |
| Dec. 25, 2009 | (JP) | 2009-294310 |
| Feb. 3, 2010 | (JP) | 2010-021944 |
| Mar. 24, 2010 | (JP) | 2010-067421 |
| Jun. 14, 2010 | (JP) | 2010-134822 |

(51) Int. Cl.
  *G03F 1/24*   (2012.01)
(52) U.S. Cl.
  USPC ............................................. 430/5
(58) Field of Classification Search
  USPC .................. 430/5, 311, 312, 313; 378/35
  See application file for complete search history.

(56) References Cited

U.S. PATENT DOCUMENTS

| 5,928,817 A | 7/1999 | Yan et al. |
| 6,410,193 B1 | 6/2002 | Stivers et al. |
| 6,479,195 B1 | 11/2002 | Kirchauer et al. |
| 6,506,526 B2 | 1/2003 | Stivers et al. |
| 6,583,068 B2 | 6/2003 | Yan et al. |

(Continued)

FOREIGN PATENT DOCUMENTS

| JP | 2005-268750 | 9/2005 |
| JP | 2005-286203 | 10/2005 |

(Continued)

OTHER PUBLICATIONS

International Search Report issued Mar. 15, 2011 in PCT/JP2010/072169 filed Dec. 9, 2010.

(Continued)

*Primary Examiner* — Stephen Rosasco
(74) *Attorney, Agent, or Firm* — Oblon, Spivak, McClelland, Maier & Neustadt, L.L.P.

(57) ABSTRACT

Provided are a multilayer mirror for EUVL in which deterioration in reflectivity due to oxidation of a Ru protective layer is prevented, and a process for its production. A multilayer mirror for EUV lithography comprising a substrate, and a reflective layer for reflecting EUV light and a protective layer for protecting the reflective layer, formed in this order on the substrate, wherein the reflective layer is a Mo/Si multilayer reflective film, the protective layer is a Ru layer or a Ru compound layer, and an intermediate layer containing from 0.5 to 25 at % of nitrogen and from 75 to 99.5 at % of Si is formed between the reflective layer and the protective layer.

11 Claims, 1 Drawing Sheet

(56) References Cited

U.S. PATENT DOCUMENTS

| | | |
|---|---|---|
| 6,593,037 B1 | 7/2003 | Gabriel et al. |
| 6,593,041 B2 | 7/2003 | Yan |
| 6,596,465 B1 | 7/2003 | Mangat et al. |
| 6,607,862 B2 | 8/2003 | Yan et al. |
| 6,610,447 B2 | 8/2003 | Yan et al. |
| 6,627,362 B2 | 9/2003 | Stivers et al. |
| 6,630,273 B2 | 10/2003 | Yan et al. |
| 6,645,679 B1 | 11/2003 | La Fontaine et al. |
| 6,653,053 B2 | 11/2003 | Mangat et al. |
| 6,699,625 B2 | 3/2004 | Lee et al. |
| 6,720,118 B2 | 4/2004 | Yan et al. |
| 6,797,368 B2 | 9/2004 | Shoki |
| 6,818,357 B2 | 11/2004 | Yan |
| 6,830,851 B2 | 12/2004 | Yan |
| 6,905,801 B2 | 6/2005 | Liang et al. |
| 6,908,713 B2 | 6/2005 | Silverman |
| 6,908,714 B2 | 6/2005 | Yan et al. |
| 6,913,706 B2 | 7/2005 | Yan et al. |
| 6,998,200 B2 | 2/2006 | Lee |
| 7,078,134 B2 | 7/2006 | Wurm et al. |
| 7,090,948 B2 | 8/2006 | Rau |
| 7,118,832 B2 | 10/2006 | Yan |
| 7,172,788 B2 | 2/2007 | Yakshin et al. |
| 7,300,724 B2 | 11/2007 | Yan |
| 7,384,715 B2 | 6/2008 | Lee |
| 7,833,682 B2 | 11/2010 | Hayashi et al. |
| 7,906,259 B2 | 3/2011 | Hayashi et al. |
| 8,088,538 B2 | 1/2012 | Hayashi et al. |
| 2006/0270226 A1 | 11/2006 | Hosoya |
| 2009/0042110 A1* | 2/2009 | Matsuo et al. .................... 430/5 |

FOREIGN PATENT DOCUMENTS

| | | |
|---|---|---|
| JP | 2006-170911 | 6/2006 |
| JP | 2006-170916 | 6/2006 |
| JP | 2006-171577 | 6/2006 |
| JP | 2006-173446 | 6/2006 |
| JP | 2006-332153 | 12/2006 |
| JP | 4068285 | 1/2008 |

OTHER PUBLICATIONS

U.S. Appl. No. 13/469,161, filed May 11, 2012, Mikami.
U.S. Appl. No. 13/478,532, filed May 23, 2012, Mikami, et al.
U.S. Appl. No. 13/472,002, filed May 15, 2012, Mikami.

* cited by examiner

MULTILAYER MIRROR FOR EUV LITHOGRAPHY AND PROCESS FOR ITS PRODUCTION

TECHNICAL FIELD

The present invention relates to a multilayer mirror for EUV (Extreme Ultraviolet) lithography (hereinafter referred to as a "multilayer mirror for EUVL" in this specification) to be used for e.g. the production of semiconductors, and a process for its production.

BACKGROUND ART

Heretofore, in the semiconductor industry, a photolithography method employing visible light or ultraviolet light has been used as a technique to transfer a fine pattern required to form an integrated circuit with a fine pattern on e.g. a silicon substrate. However, the conventional photolithography method has come close to its limit, while miniaturization of semiconductor devices is being accelerated. In the case of the photolithography method, the resolution limit of a pattern is about ½ of the exposure wavelength. Even if an immersion method is employed, the resolution limit is said to be about ¼ of the exposure wavelength, and even if an immersion method of ArF laser (193 nm) is employed, about 45 nm is presumed to be the limit. Under the circumstances, as an exposure technique for the next and subsequent generation employing an exposure wavelength shorter than 45 nm, EUV lithography is expected to be prospective, which is an exposure technique employing EUV light having a wavelength further shorter than ArF laser. In this specification, EUV light is meant for light ray having a wavelength within a soft X-ray region or within a vacuum ultraviolet region, specifically for light ray having a wavelength of from about 10 to 20 nm, particularly about 13.5 nm±0.3 nm.

EUV light is likely to be absorbed by all kinds of substances, and the refractive index of substances at such a wavelength is close to 1, whereby it is not possible to use a conventional refractive optical system like photolithography employing visible light or ultraviolet light. Therefore, in EUV lithography, a reflective optical system, i.e. a reflective photomask and mirror, is employed.

A mirror to be used for EUV lithography has a structure wherein a reflective layer for reflecting EUV light is formed on a substrate made of e.g. glass. As the reflective layer, a multilayer reflective film having high refractive index layers and low refractive index layers alternately laminated plural times is usually used, since a high EUV reflectivity can be thereby accomplished. Therefore, as a mirror to be used for EUV lithography, such a multilayer mirror having a multilayer reflective film formed on a substrate is usually employed (Patent Document 1).

In such a multilayer mirror, a protective layer (a protective capping layer) is formed on such a multilayer reflective film for the purpose of protecting the multilayer reflective film from chemical or physical erosion.

The multilayer mirror disclosed in Patent Document 1 is provided with a protective capping layer made of a material selected from ruthenium (Ru) and rhodium (Rh), and their compounds and alloys.

PRIOR ART DOCUMENT

Patent Document

Patent Document 1: Japanese Patent No. 4,068,285

DISCLOSURE OF INVENTION

Technical Problem

As the multilayer reflective film for a multilayer mirror for EUVL, a Mo/Si multilayer reflective film is usually used wherein a molybdenum (Mo) layer is used as a low refractive index layer, and a silicon (Si) layer is used as a high refractive index layer.

As the material for the protective layer in the multilayer mirror for EUVL, Ru is preferably employed, since a high reflectivity can be obtained even when the surface of the protective layer is irradiated with EUV light.

However, in a case where Ru is employed as the material for the protective layer, there is a problem such that the EUV light reflectivity at the time when the protective layer surface is irradiated with EUV light is likely to be low, since the Ru protective layer and further, the uppermost layer of the multilayer reflective film (the Si layer in the case of the Mo/Si multilayer reflective film) are oxidized in a step for producing such a multilayer mirror (e.g. a washing step, a heating step, etc.) or during the EUV exposure in the EUV lithography.

Especially, deterioration of the EUV light reflectivity during the EUV exposure progresses as the time passes, thus leading to such a problem that it is required to change the exposure conditions in a half way, it is required to change the multilayer mirror for EUVL, or the useful life of the multilayer mirror for EUVL tends to be short.

Hereinafter, in this specification, deterioration of the EUV light reflectivity at the time when the protective layer surface is irradiated with EUV light, due to oxidation of the Ru protective layer and further the uppermost layer of the multilayer reflective film in a step for producing the multilayer mirror for EUVL (e.g. a washing step, a heating step, etc.) or during the EUV exposure in the EUV lithography, may be referred to simply as "deterioration in the EUV light reflectivity due to oxidation of the Ru protective layer".

From the above-mentioned viewpoint, it is an object of the present invention to provide a multilayer mirror for EUVL in which deterioration in the EUV light reflectivity due to oxidation of the Ru protective layer is prevented, and a process for its production.

Solution to Problem

The present inventors have conducted an extensive study to solve the above problem and as a result, have found it possible to suppress the deterioration of the EUV light reflectivity due to oxidation of the Ru protective layer by forming an intermediate layer containing nitrogen and Si in prescribed amounts, between the Mo/Si multilayer reflective film and the Ru protective layer.

The present invention has been made based on the above discovery by the present inventors and provides a multilayer mirror for EUV lithography (a multilayer mirror for EUVL) comprising a substrate, and a reflective layer for reflecting EUV light and a protective layer for protecting the reflective layer, formed in this order on the substrate, wherein
the reflective layer is a Mo/Si multilayer reflective film,
the protective layer is a Ru layer or a Ru compound layer, and
an intermediate layer containing from 0.5 to 25 at % of nitrogen and from 75 to 99.5 at % of Si is formed between the reflective layer and the protective layer.

It is preferred that the uppermost layer of the reflective layer made of a Mo/Si multilayer reflective film is a Si film, and the intermediate layer is formed in contact with the Si film.

In the multilayer mirror for EUVL of the present invention, it is preferred that the thickness of the intermediate layer is from 0.2 to 2.5 nm.

In the multilayer mirror for EUVL of the present invention, it is preferred that the surface roughness rms of the surface of the protective layer is at most 0.5 nm.

In the multilayer mirror for EUVL of the present invention, it is preferred that the thickness of the protective layer is from 1 to 10 nm.

Further, the present invention provides a process for producing a semiconductor integrated circuit, which comprises subjecting an object to be exposed to exposure by means of the above-described multilayer mirror for EUVL of the present invention to produce a semiconductor integrated circuit.

Further, the present invention provides a process for producing a multilayer mirror for EUV lithography (EUVL), which comprises forming a multilayer reflective film for reflecting EUV light on a film-forming surface of a substrate and then, forming a protective layer for protecting the multilayer reflective film, on the multilayer reflective film, to produce a multilayer mirror for EUVL, wherein the multilayer reflective film is a Mo/Si multilayer reflective film, the protective layer is a Ru layer or a Ru compound layer, and after forming the Mo/Si multilayer reflective film, the surface of a Si layer as the uppermost layer of the Mo/Si multilayer reflective film is exposed to a nitrogen-containing atmosphere without exposing it to the atmospheric air, and then, the protective layer is formed.

In the process for producing a multilayer mirror for EUVL of the present invention, it is preferred that the product of the nitrogen partial pressure (Torr) of the nitrogen-containing atmosphere and the exposure time (s) is at least $1 \times 10^{-6}$ Torr·s ($=1.33 \times 10^{-4}$ Pa·s)=1 L (Langmuir)), and the temperature of the nitrogen-containing atmosphere is from 0 to 170° C.

In the process for producing a multilayer mirror for EUVL of the present invention, it is more preferred that the product of the nitrogen partial pressure (Torr) of the nitrogen-containing atmosphere and the exposure time (s) is at least $1 \times 10^{-6}$ Torr·s, and the temperature of the nitrogen-containing atmosphere is from 0 to 160° C.

In the process for producing a multilayer mirror for EUVL of the present invention, it is further preferred that the product of the nitrogen partial pressure (Torr) of the nitrogen-containing atmosphere and the exposure time (s) is at least $1 \times 10^{-6}$ Torr·s, and the temperature of the nitrogen-containing atmosphere is from 0 to 150° C.

In the process for producing a multilayer mirror for EUVL of the present invention, in order to promote incorporation of nitrogen to the surface of the Si layer, it is preferred that when the surface of the Si layer is exposed to the nitrogen-containing atmosphere, the nitrogen-containing atmosphere is maintained to be in a plasma state, or the surface of the Si layer is subjected to thermal treatment, or the surface of the Si layer is irradiated with ultraviolet rays.

Advantageous Effects of Invention

In the multilayer mirror for EUVL of the present invention, deterioration in the EUV light reflectivity due to oxidation of the Ru protective layer is prevented. Further, according to the process of the present invention, it is possible to produce a multilayer mirror for EUVL in which deterioration in the EUV light reflectivity due to oxidation of the Ru protective layer is prevented. Further, since deterioration in the EUV light reflectivity is prevented, the multilayer mirror for EUV lithography of the present invention can be effectively used for the production of a semiconductor integrated circuit, and it is thereby possible to produce a semiconductor integrated circuit having a fine pattern with a high production efficiency.

DESCRIPTION OF EMBODIMENTS

Now, the present invention will be described with reference to the drawing.

Figure 1:
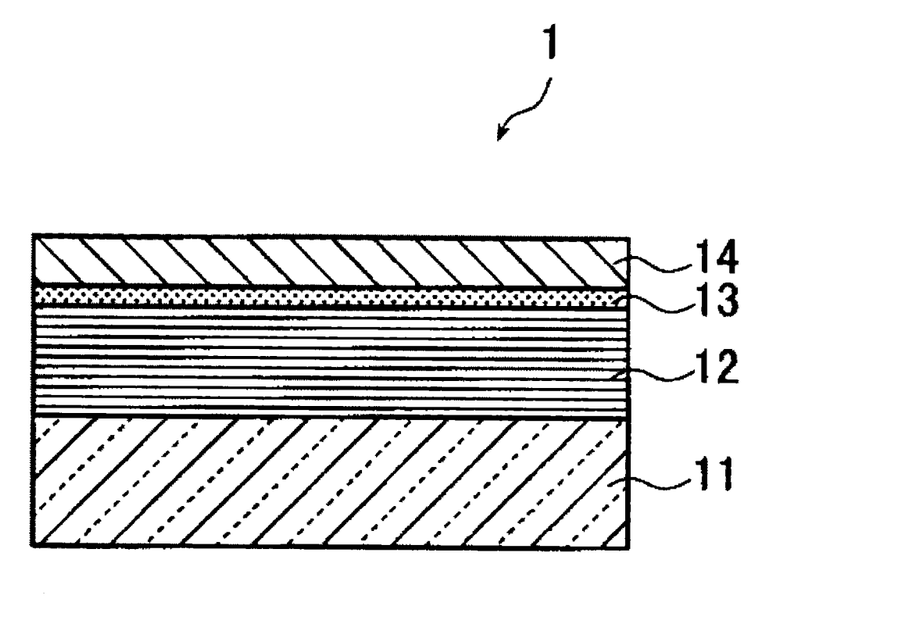
FIG. 1 is a schematic cross-sectional view illustrating an embodiment of the multilayer mirror for EUVL of the present invention.

FIG. 1 is a schematic cross-sectional view illustrating one embodiment of the multilayer mirror for EUVL of the present invention. A multilayer mirror 1 for EUVL shown in FIG. 1 has a reflective layer 12 for reflecting EUV light and a protective layer 14 for protecting the reflective layer 12, formed in this order on a substrate 11. However, in the multilayer mirror for EUVL of the present invention, an intermediate layer 13 containing the after-described prescribed amounts of nitrogen and Si, is formed between the reflective layer 12 and the protective layer 14.

Now, the respective constituting elements of the multilayer mirror 1 for EUVL will be described.

The substrate 11 satisfies the properties as a substrate for a multilayer mirror for EUVL.

Therefore, it is important that the substrate 11 has a low thermal expansion coefficient. Specifically, the thermal expansion coefficient of the substrate 11 is preferably $0 \pm 1.0 \times 10^{-7}$/° C., more preferably $0 \pm 0.3 \times 10^{-7}$/° C., further preferably $0 \pm 0.2 \times 10^{-7}$/° C., further preferably $0 \pm 0.1 \times 10^{-7}$/° C., particularly preferably $0 \pm 0.05 \times 10^{-7}$/° C. Further, the substrate preferably has a smooth planarity and is excellent in durability against a cleaning liquid to be used for e.g. cleaning of the multilayer mirror for EUVL. As the substrate 11, specifically, a glass having a low thermal expansion coefficient, e.g. a $SiO_2$—$TiO_2$ type glass or the like, may be used. However, the substrate is not limited thereto, and it is possible to employ a substrate of e.g. crystallized glass having β-quartz solid solution precipitated, quartz glass, silicon, or a metal. Further, a film such as a stress correcting film may be formed on the substrate 11.

The substrate 11 preferably has a smooth surface having a surface roughness rms of at most 0.15 nm, whereby a high reflectivity can be obtained in the multilayer mirror for EUVL.

The size, thickness, etc. of the substrate 11 are suitably determined depending upon e.g. designed values for the mirror.

It is desired that no defect is present on the surface of the substrate 11 on the side where the multilayer reflective film 12 is to be formed.

The property particularly required for the reflective layer 12 of the multilayer mirror for EUVL is a high EUV light reflectivity. Specifically, when light ray within an EUV wavelength region is applied at an incident angle of 6° to the surface of the reflective layer 12, the maximum value of the reflectivity of the light ray in the vicinity of a wavelength of 13.5 nm is preferably at least 60%, more preferably at least 65%. Further, even in a case where an intermediate layer 13 and a protective layer 14 are formed on the reflective layer 12, the maximum value of the reflectivity of light ray in the vicinity of a wavelength of 13.5 nm is preferably at least 60%, more preferably at least 65%.

As a reflective layer for a multilayer mirror for EUVL, a multilayer reflective film having a high refractive index layer and a low refractive index layer alternately laminated plural times is widely used, since a high reflectivity can thereby be accomplished in the EUV wavelength region.

In the multilayer mirror for EUVL of the present invention, it is preferred to employ a Mo/Si multilayer reflective film having a Mo layer as a low refractive index layer and a Si layer as a high refractive index layer alternately laminated plural times.

In such a Mo/Si multilayer reflective film, it is preferred that the uppermost layer of the laminated Mo/Si multilayer reflective film is made to be a Si film.

In the case of the Mo/Si multilayer reflective film, in order to obtain a reflective layer 12 having the maximum value of the EUV light reflectivity being at least 60%, a Mo layer having a thickness of 2.3±0.1 nm and a Si layer having a thickness of 4.5±0.1 nm may be laminated repeatedly so that the number of repeating units becomes from 30 to 60.

Here, each layer constituting the Mo/Si multilayer reflective film may be formed to have a desired thickness by means of a well-known film-forming method such as a magnetron sputtering method or an ion beam sputtering method. For example, in the case of forming a Mo/Si multilayer reflective film by means of an ion beam sputtering method, it is preferred that a Mo layer is formed to have a thickness of 2.3 nm at an ion accelerating voltage of from 300 to 1,500 V and a film-deposition rate of 0.03 to 0.30 nm/sec by using a Mo target as the target and an Ar gas (gas pressure: $1.3 \times 10^{-2}$ Pa to $2.7 \times 10^{-2}$ Pa) as the sputtering gas, and then a Si layer is formed to have a thickness of 4.5 nm at an ion accelerating voltage of from 300 to 1,500 V and a film-deposition rate of from 0.03 to 0.30 nm/sec by using a Si target as the target and an Ar gas (gas pressure: $1.3 \times 10^{-2}$ Pa to $2.7 \times 10^{-2}$ Pa) as the sputtering gas. When this operation is taken as one cycle, the Mo/Si multilayer reflective film is formed by laminating the Mo layer and the Si layer by from 40 to 50 cycles.

In the multilayer mirror for EUVL of the present invention, deterioration in the EUV light reflectivity due to oxidation of the Ru protective layer is prevented by forming an intermediate layer 13 containing from 0.5 to 25 at % of nitrogen and from 75 to 99.5 at % of Si, between the reflective layer 12 and the protective layer 14. The reason as to why deterioration in the EUV light reflectivity due to oxidation of the Ru protective layer is prevented by forming the intermediate layer 13 having the above composition between the reflective layer 12 and the protective layer 14, is considered to be as follows.

By preliminarily incorporating nitrogen to the intermediate layer 13 in order to prevent deterioration in reflectivity due to inclusion of a large amount of oxygen by oxidation of the Ru protective layer in the Si film as the uppermost layer of the reflective layer 12, the intermediate layer 13 having the above composition is considered to have an effect to prevent oxidation and to secure a high reflectivity after the film formation. Thus, even in a situation where the Ru protective layer is likely to be oxidized in a step to be carried out during the production of the multilayer mirror for EUVL (such as in each step of cleaning, defect inspection, heating, defect correction or the like) or during the EUV exposure in the EUV lithography, by the presence of the intermediate layer 13 having the effect to prevent oxidation, oxidation of the Mo/Si multilayer reflective film present beneath the intermediate layer 13, more specifically, oxidation of the Si layer as the uppermost layer of the Mo/Si multilayer reflective film, is considered to be prevented, and as a result, deterioration in the EUV light reflectivity due to oxidation of the Ru protective layer, is considered to be prevented.

Here, by forming the intermediate layer 13 between the reflective layer 12 (Mo/Si multilayer reflective film) and the protective layer 14 (Ru protective layer), it is also possible to prevent diffusion of Si in the Si layer as the uppermost layer of the Mo/Si multilayer reflective film into the Ru protective layer during the formation of the protective layer 14.

If the content of nitrogen in the intermediate layer 13 is less than 0.5 at %, it is likely that the above-described effect to prevent further oxidation tends to be inadequate, whereby it is likely that the effect to prevent deterioration in the EUV light reflectivity due to oxidation of the Ru protective layer tends to be inadequate.

As described in detail hereinafter, in the present invention, the intermediate layer 13 having the above composition can be formed in such a manner that after forming the Mo/Si multilayer reflective film, the surface of the Si layer as the uppermost layer of the Mo/Si multilayer reflective film is exposed to a nitrogen-containing atmosphere. However, in a case where the content of nitrogen in the intermediate layer 13 exceeds 25 at %, nitrogen is considered to be incorporated either during the film formation of the Si layer as the uppermost layer of the Mo/Si multilayer reflective film, or during the film formation of the protective layer 14 to be formed on the intermediate layer 13 or during the film formation of both, but the film having the nitrogen thus incorporated is likely to have defects increased during the film formation, thus leading to a problem. That is, in a case where the protective layer is made of Ru, by forming the intermediate layer to have the above-described composition, a better effect can be obtained.

With a view to preventing deterioration in the EUV light reflectivity, the intermediate layer 13 contains preferably from 0.5 to 15 at % of nitrogen and from 85 to 99.5 at % of Si, more preferably from 0.5 to 10 at % of nitrogen and from 80 to 99.5 at % of Si, further preferably from 1 to 9 at % of nitrogen and from 91 to 99 at % of Si, further preferably from 3 to 9 at % of nitrogen and from 91 to 97 at % of Si, particularly preferably from 5 to 8 at % of nitrogen and from 92 to 95 at % of Si.

The intermediate layer 13 preferably contains no fluorine, since otherwise, Si in the intermediate layer 13 is likely to be eroded. Further, the intermediate layer 13 preferably contains no carbon or hydrogen, since if carbon or hydrogen is contained in the intermediate layer 13, it is likely to react with oxygen in the intermediate layer 13, whereby oxygen is discharged in the intermediate layer 13 to deteriorate the structure of the intermediate layer 13. For these reasons, the contents of fluorine, carbon and hydrogen in the intermediate layer 13 are preferably at most 3 at %, more preferably at most 1 at %, particularly preferably at most 0.05 at %, respectively. Further, likewise, the content of an element such as Ni, Y, Ti, La, Cr or Rh in the intermediate layer 13, is preferably at most 3 at %, more preferably at most 1 at %, particularly preferably at most 0.05 at %, by the total content of these elements.

Further, the content of oxygen in the intermediate layer 13 is also preferably at most 3 at %, more preferably at most 1 at %.

In the present invention, the thickness of the intermediate layer 13 is preferably from 0.2 to 2.5 nm, more preferably from 0.4 to 2 nm, further preferably from 0.5 to 1.5 nm, from the viewpoint of the effect to prevent deterioration in the EUV light reflectivity due to oxidation of the Ru protective layer. Further, the thickness of the Si layer as the uppermost layer of the multilayer reflective film is preferably from 2 to 4.8 nm, more preferably from 2.5 to 4.5 nm, particularly preferably from 3.0 to 4 nm, in order to form the intermediate layer 13 by exposing it to the nitrogen-containing atmosphere.

In the present invention, after forming the Mo/Si multilayer reflective film, the intermediate layer 13 having the above composition can be formed by exposing the surface of the Si layer as the uppermost layer of the Mo/Si multilayer reflective film to a nitrogen-containing atmosphere without exposing it to the atmospheric air, thereby to slightly nitride the surface of the Si layer, i.e. to incorporate nitrogen to the surface of the Si layer. Here, in this specification, the nitrogen-containing atmosphere means a nitrogen gas atmosphere or a mixed gas atmosphere of nitrogen gas and an inert gas such as argon. In the case of such a mixed gas atmosphere, the nitrogen gas concentration in the atmosphere is preferably at least 20 vol %, more preferably at least 50 vol %, further preferably at least 80 vol %.

Here, after forming the Mo/Si multilayer reflective film, the surface of the Si layer as the uppermost layer of the Mo/Si multilayer reflective film is exposed to the nitrogen-containing atmosphere without exposing it to the atmospheric air, for such a reason that if the Si layer surface is exposed to the atmospheric air before exposing it to the nitrogen atmosphere, the Si layer surface is oxidized, and even if thereafter exposed to the nitrogen atmosphere, nitrogen cannot be incorporated to the Si layer surface by nitriding of the Si layer surface, whereby it is likely that it is not possible to form an intermediate layer 13 containing nitrogen and Si.

In the present invention, the nitrogen-containing atmosphere to which the Si layer surface is exposed, is preferably such that the product of the nitrogen partial pressure (Torr) and the exposure time (s) is preferably at least $1\times10^{-6}$ Torr·s (=1 L (Langmuir)). In a case where the nitrogen partial pressure is represented by Pa, the product of the nitrogen partial pressure (Pa) of the nitrogen-containing atmosphere and the exposure time (s) is preferably at least $1.33\times10^{-4}$ Pa·s.

The product of the nitrogen partial pressure and the exposure time is an index showing a frequency of impingement of nitrogen in the nitrogen-containing atmosphere to the Si layer surface, and in this specification, it may sometimes be referred to as a "exposure amount of nitrogen". In order to form the intermediate layer 13 having the above composition by nitriding of the Si layer surface, such a value is preferably at least $1\times10^{-6}$ Torr·s (at least $1.33\times10^{-4}$ Pa·s), more preferably at least $1\times10^{-3}$ Torr·s (at least $1.33\times10^{-1}$ Pa·s), further preferably at least $1\times10^{-2}$ Torr·s (at least 1.33 Pa·s), further preferably at least $1\times10^{-1}$ Torr·s (at least 13.3 Pa·s). Further, the product of the nitrogen partial pressure and the exposure time is preferably at most 1,000 Torr·s.

Here, the nitrogen partial pressure in the nitrogen-containing atmosphere to which the Si layer surface is exposed, is preferably from $1\times10^{-4}$ Torr to 820 Torr (from $1.33\times10^{-2}$ Pa to 109.32 kPa).

Here, in a case where the nitrogen-containing atmosphere is a nitrogen gas atmosphere, the above nitrogen partial pressure means the atmosphere pressure of the nitrogen gas atmosphere.

In order to prevent oxidation of the Si layer surface, it is preferred that the oxygen concentration in the nitrogen-containing atmosphere to which the Si layer surface is exposed, is very low. Specifically, in a case where the nitrogen partial pressure in the nitrogen-containing atmosphere is within the above range, i.e. in a case where the nitrogen partial pressure in the nitrogen-containing atmosphere is from $1\times10^{-4}$ Torr to 820 Torr (from $1.33\times10^{-2}$ Pa to 109.32 kPa), it is preferred that the oxygen partial pressure in the atmosphere is at most $1\times10^{-6}$ Torr ($1.33\times10^{-4}$ Pa).

Further, in order to prevent oxidation of the Si layer surface, it is preferred that the concentration of a gas component comprising $O_3$, $H_2O$ and a compound containing an OH group in the nitrogen-containing atmosphere to which the Si layer surface is exposed, is also very low. Specifically, in a case where the nitrogen partial pressure in the nitrogen-containing atmosphere is within the above range, i.e. in a case where the nitrogen partial pressure in the nitrogen-containing atmosphere is from $1\times10^{-4}$ Torr to 820 Torr (from $1.33\times10^{-2}$ Pa to 109.32 kPa), the partial pressure of the gas component comprising $O_3$, $H_2O$ and a compound containing an OH group in the atmosphere is preferably at most $1\times10^{-6}$ Torr ($1.33\times10^{-4}$ Pa), respectively.

Further, the concentration of $F_2$ in the nitrogen-containing atmosphere is also preferably very low, since otherwise the Si layer is likely to be thereby eroded. Specifically, in a case where the nitrogen partial pressure in the nitrogen-containing atmosphere is within the above range, i.e. in a case where the nitrogen partial pressure in the nitrogen-containing atmosphere is from $1\times10^{-4}$ Torr to 820 Torr (from $1.33\times10^{-2}$ Pa to 109.32 kPa), the partial pressure of $F_2$ in the atmosphere is preferably at most $1\times10^{-6}$ Torr ($1.33\times10^{-4}$ Pa).

In the present invention, the temperature of the nitrogen-containing atmosphere to which the Si layer surface is exposed, is preferably from 0 to 170° C. If the temperature of the nitrogen-containing atmosphere is less than 0° C., a problem of an influence due to adsorption of the residual moisture in vacuum is likely to occur. If the temperature of the nitrogen-containing atmosphere exceeds 170° C., it is likely that nitriding of the Si layer proceeds excessively, thus leading to deterioration in the EUV light reflectivity of the Mo/Si multilayer reflective film.

The temperature of the nitrogen-containing atmosphere is more preferably from 10 to 160° C., further preferably from 20 to 150° C., further preferably from 20 to 140° C., further preferably from 20 to 120° C.

Further, as described hereinafter, at the time of exposing the Si layer surface to the nitrogen-containing atmosphere, the Si layer surface may be thermally treated within the above temperature range.

In the present invention, by forming the intermediate layer 13 by exposing the surface of the Si layer as the uppermost layer of the Mo/Si multilayer reflective film to the nitrogen-containing atmosphere, it is possible to improve the durability against oxidation without deterioration in the EUV light reflectivity after the film formation of the protective layer 14 (Ru protective layer), such being desirable.

In Examples 1 and 2 given hereinafter, the time for exposing the Si layer surface to the nitrogen-containing atmosphere is set to be 600 sec and 6,000 sec, respectively, but the time for exposing the Si layer surface to the nitrogen-containing atmosphere is not limited thereto and may suitably be selected within a range to satisfy the above-described conditions relating to the nitrogen-containing atmosphere.

Further, as in the procedure shown in Examples 3 and 4, after forming the Mo/Si multilayer reflective film, at the time of exposing the surface of the Si layer as the uppermost layer of the Mo/Si multilayer reflective film to the nitrogen-containing atmosphere without exposing it to the atmospheric air, thermal treatment may be carried out in the nitrogen-containing atmosphere to form the intermediate layer 13. By subjecting the surface of the Si layer as the uppermost layer of the Mo/Si multilayer reflective film to such thermal treatment at the time of exposing it to the nitrogen atmosphere, nitriding of the Si layer surface i.e. incorporation of nitrogen into the Si layer surface, is accelerated.

Here, in order to carry out, after forming the Mo/Si multilayer reflective film, thermal treatment of the surface of the Si layer as the uppermost layer of the Mo/Si multilayer reflective film in the nitrogen-containing atmosphere without exposing it to the atmospheric air, after the formation of the Si layer, while maintaining the substrate having the Mo/Si multilayer reflective film formed thereon, in the film-forming chamber wherein the Si layer has been formed or in a chamber adjacent to such a film-forming chamber, the gas in the chamber is replaced with nitrogen gas (or a mixed gas of nitrogen gas with an inert gas such as argon), and the Si layer may be thermally treated in such a replaced gas.

The thermal treatment temperature at the time of thermally treating the Si layer surface in the nitrogen-containing atmosphere, is preferably from 120 to 160° C., particularly preferably from 130 to 150° C.

Like in the procedure shown in Examples 1 to 4, the procedure for exposing in the reduced-pressure atmosphere the Si layer surface to the nitrogen gas or to the mixed gas of nitrogen gas with an inert gas such as argon, is preferably such that in a case where film forming of the multilayer reflective film and the film forming of the protective layer are carried out in the same chamber, it is important to evacuate the nitrogen gas (or the mixed gas of nitrogen gas with an inert gas such as argon) after carrying out the procedure for exposing the Si layer surface to the nitrogen gas (or to the mixed gas of nitrogen gas with an inert gas such as argon) and before carrying out the film formation of the protective layer. Further, this procedure is preferred also in that it is possible to control the nitrogen content in the intermediate layer 13 by controlling the exposure amount of the nitrogen gas (or the mixed gas of nitrogen gas with an inert gas such as argon) to the Si layer surface.

It has been mentioned above that like in the procedure shown in Examples 3 and 4, after forming the Mo/Si multilayer reflective film, by subjecting the surface of the Si layer as the uppermost layer of the Mo/Si multilayer reflective film to thermal treatment with the nitrogen-containing atmosphere at the time of exposing it to the nitrogen-containing atmosphere without exposing it to the atmospheric air, it is possible to accelerate nitriding of the Si layer surface i.e. incorporation of nitrogen into the Si layer surface. It is also preferred that in the case of exposing in the reduced pressure atmosphere the Si layer surface to the nitrogen gas or the mixed gas of nitrogen gas with an inert gas such as argon, the reduced pressure atmosphere is maintained in a plasma state in order to accelerate nitriding of the Si layer surface i.e. incorporation of nitrogen into the Si layer surface.

However, even in such a case, if the Si layer surface is ion-irradiated with nitrogen gas (or a mixed gas of nitrogen gas with an inert gas such as argon) ionized in a plasma state by application of a voltage, ionized nitrogen is likely to impinge on the Si layer surface in an accelerated state, whereby nitriding of the Si layer is likely to proceed excessively to cause deterioration in the EUV light reflectivity of the Mo/Si multilayer reflective film. Therefore, it is particularly preferred not to apply a voltage to the nitrogen gas (or the mixed gas of nitrogen gas with an inert gas such as argon) ionized in a plasma state, i.e. not to apply ion-irradiation, so that it is possible to control the amount of nitrogen in the intermediate layer 13 to be at a proper level.

Further, in a case where in a reduced pressure atmosphere, the Si layer surface is exposed to nitrogen gas or a mixed gas of nitrogen gas with an inert gas such as argon, it is also preferred that in the reduced pressure atmosphere, the Si layer surface is irradiated with ultraviolet rays, in order to accelerate nitriding of the Si layer surface i.e. incorporation of nitrogen into the Si layer surface.

In the present invention, in a case where after forming the Mo/Si multilayer reflective film, at the time of exposing the surface of the Si layer as the uppermost layer of the Mo/Si multilayer reflective film to the nitrogen-containing atmosphere without exposing it to the atmospheric air, thermal treatment is carried out in the nitrogen-containing atmosphere, or the nitrogen-containing atmosphere is maintained in a plasma state, or the Si layer surface is irradiated with ultraviolet rays in the nitrogen-containing atmosphere, the nitrogen-containing atmosphere is preferably a reduced pressure atmosphere. The pressure of such a reduced pressure atmosphere is preferably from 0.01 to 0.5 mTorr, more preferably from 0.1 to 0.5 mTorr. Further, in a case where the nitrogen-containing atmosphere is maintained in a plasma state, or the Si layer surface is irradiated with ultraviolet rays in the nitrogen-containing atmosphere, the temperature of such a reduced pressure atmosphere is more preferably from 0 to 170° C.

The protective layer 14 is provided for the purpose of protecting the reflective layer 12 from chemical or physical erosion. In a multilayer mirror for EUVL, the protective layer is formed on the reflective layer 12 in order to prevent a damage to the reflective layer 12 in a cleaning step employing e.g. ozone water which is carried out after the production of the multilayer mirror for EUVL, a damage to the reflective layer 12 by irradiation with EUV light for a long period of time which is carried out to increase the productivity in an exposure machine held in vacuum, or a damage to the reflective layer 12 by cleaning which is carried out for the purpose of removing carbon contamination on the surface of the multilayer mirror for EUVL.

Accordingly, for the protective layer 14, the material is selected from the viewpoint of preventing damages to the reflective layer 12.

Further, the protective layer 14 is preferably such that the protective layer 14 itself also has a high EUV light reflectivity in order not to impair the EUV light reflectivity at the reflective layer 12 even after forming the protective layer 14.

In the present invention, in order to satisfy the above conditions, as the protective layer 14, a Ru layer or a Ru compound layer may, for example, be formed. As such a Ru compound, at least one member selected from the group consisting of RuB, RuNb and RuZr is preferred. In a case where the protective layer 14 is a Ru compound layer, the content of Ru is preferably at least 50 at %, more preferably at least 80 at %, particularly preferably at least 90 at %. However, in a case where the protective layer 14 is a RuNb layer, the content of Nb in the protective layer 14 is preferably from 5 to 40 at %, more preferably from 5 to 30 at %.

In the present invention, the surface roughness rms of the surface of the protective layer 14 is preferably at most 0.5 nm. Here, the surface roughness rms being at most 0.5 nm means that the root-mean-square surface roughness is at most 0.5 nm. If the surface roughness of the surface of the protective layer 14 is large, the EUV light reflectivity tends to deteriorate.

When the surface roughness rms of the surface of the protective layer 14 is at most 0.5 nm, the EUV light reflectivity can be increased, such being desirable. The surface roughness rms of the surface of the protective layer 14 is more preferably at most 0.4 nm, further preferably at most 0.3 nm.

The thickness of the protective layer 14 is preferably from 1 to 10 nm, whereby the EUV light reflectivity can be increased. The thickness of the protective layer 14 is more preferably from 1 to 5 nm, further preferably from 2 to 4 nm.

The protective layer 14 may be formed by means of a well-known film forming method such as a magnetron sputtering method or an ion beam sputtering method.

In a case where a Ru layer is formed as the protective layer 14 by means of an ion beam sputtering method, discharge may be made in an argon (Ar) atmosphere by using a Ru target as the target.

Specifically, the ion beam sputtering may be carried out under the following conditions.

Sputtering gas: Ar (gas pressure: from $1.3 \times 10^{-2}$ Pa to $2.7 \times 10^{-2}$ Pa)
Ion accelerating voltage: from 300 to 1,500 V
Film forming rate: from 0.03 to 0.30 nm/sec The multilayer mirror for EUVL of the present invention is such that when the surface of the protective layer 14 is cleaned with ozone water in accordance with the procedure described in Examples given hereinafter, deterioration in the EUV light reflectivity as between before and after the cleaning is at most 0.9%, more preferably at most 0.5%.

In a case where the multilayer mirror for EUVL of the present invention is thermally treated in accordance with the procedure described in Examples given hereinafter, deterioration in the EUV light reflectivity as between before and after the thermal treatment is preferably at most 7%, more preferably at most 6%.

Here, the reason as to why the value of deterioration in the EUV light reflectivity as between before and after the thermal treatment is large as compared with the deterioration in EUV light reflectivity as between before and after cleaning with ozone water is such that in Examples given hereinafter, in order to ascertain the effects by the present invention, thermal treatment was carried out under severer conditions than in the heating step which is carried out for the production of a multilayer mirror for EUVL.

A method for producing a semiconductor integrated circuit using the multilayer mirror for EUVL according to the present invention will be described. In the present invention, a process for producing a semiconductor integrated circuit by means of a photolithography method using EUV light as the light source for exposure may be applied. Specifically, a substrate such as a silicon wafer coated with a resist is disposed on a stage, and a reflective photomask is set on a reflective exposure apparatus using the above-described multilayer mirror for EUVL as a reflective mirror. And, EUV light from a light source is applied to the photomask via the reflective mirror to have the EUV light reflected by the photomask and is applied to the substrate coated with the resist. By such a pattern transfer step, a circuit pattern is transferred to the substrate. The substrate having a circuit pattern transferred thereto is subjected to etching of sensitized or non-sensitized portions by development, followed by peeling of the resist. A semiconductor integrated circuit is produced by repeating such a process.

EXAMPLES

Now, the present invention will be described in further detail with reference to Examples.

Example 1

In this Example, a multilayer mirror 1 for EUVL as shown in FIG. 1 was prepared.

As a substrate 11 for film formation, a $SiO_2$—$TiO_2$ type glass substrate was used. The thermal expansion coefficient of this glass substrate was $0.2 \times 10^{-7}$/° C., the Young's modulus was 67 GPa, the Poisson ratio was 0.17, and the specific rigidity was $3.07 \times 10^7$ m$^2$/s$^2$. This glass substrate was polished to form a smooth surface having a surface roughness rms of at most 0.15 nm.

On the surface of such a substrate 11, a Mo layer and a Si layer were alternately deposited by means of an ion beam sputtering method in 50 cycles to form a Mo/Si multilayer reflective film (reflective layer 12) having a total thickness of 340 nm ((2.3 nm+4.5 nm)×50). Here, the uppermost layer of the multilayer reflective film 12 is a Si layer.

The film forming conditions for the Mo layer and the Si layer are as follows.

(Film Forming Conditions for Mo Layer)
Target: Mo target
Sputtering gas: Ar gas (gas pressure: 0.02 Pa)
Voltage: 700 V
Film forming rate: 0.064 nm/sec
Film thickness: 2.3 nm (Film Forming Conditions for Si Layer)
Target: Si target (boron-doped)
Sputtering gas: Ar gas (gas pressure: 0.02 Pa)
Voltage: 700 V
Film forming rate: 0.077 nm/sec
Film thickness: 4.5 nm Then, the surface of the Si layer as the uppermost layer of the Mo/Si multilayer reflective film was exposed to a nitrogen-containing atmosphere under the following conditions.

(Exposure Conditions)
Carrier gas: Ar gas, flow rate: 17 sccm
Exposure gas: nitrogen gas, flow rate: 50 sccm (during RF discharge, nitrogen gas and carrier gas were supplied)
Nitrogen gas partial pressure: 0.2 mTorr ($2.6 \times 10^{-2}$ Pa)
Atmosphere pressure: 0.3 mTorr (3.5 Torr×$10^{-2}$ Pa)
Atmosphere temperature: 20° C.
Exposure time: 600 sec
Exposure amount: $1.2 \times 10^5$ L (1 L (Langmuir)=$1 \times 10^{-6}$ Torr·s=$1.33 \times 10^{-4}$ Pa·s)
Frequency of RF discharge: 1.8 MHz
RF power: 500 W Then, a Ru layer as the protective layer 14 was formed by using an ion beam sputtering method.

The conditions for forming the protective layer 14 are as follows.

Target: Ru target
Sputtering gas: Ar gas (gas pressure: 0.02 Pa)
Voltage: 700 V
Film forming rate: 0.052 nm/sec
Film thickness: 2.5 nm With respect to a multilayer mirror for EUVL obtained in the above procedure, the following evaluations were carried out.

(1) Film Composition

By measuring the composition in the depth direction from the surface of the protective layer 14 to the reflective layer (Mo/Si multilayer reflective film) 12 by means of an X-ray Photoelectron Spectrometer (Quantera SXM, manufactured by ULVAC-PHI, Inc.), it was confirmed that an intermediate layer 13 was formed between the protective layer 14 and the Si layer as the uppermost layer of the Mo/Si multilayer reflective film. The composition of the intermediate layer 13 was such that nitrogen was 6 at %, and Si was 94 at %. Further, the thickness of the intermediate layer 13 was 1 nm.

(2) Surface Roughness

The surface roughness of the protective layer 14 was confirmed by means of an Atomic Force Microscope (No. SPI3800, manufactured by Seiko Instruments Inc.) in accordance with JIS-B0601 (1994). The surface roughness rms of the protective layer 14 was 0.15 nm.

(3) Cleaning Durability

The surface of the protective layer 14 was treated by spin cleaning with ozone water for a total of 600 seconds. Before and after this treatment, the EUV reflectivity was measured by means of an EUV reflectivity meter by applying EUV light (wavelength: 13.5 nm) to the surface of the protective layer 14. Deterioration in the EUV reflectivity as between before and after this treatment was 0.5%.

(4) Thermal Treatment Durability

To the multilayer mirror for EUVL, thermal treatment (in the atmospheric air) at 210° C. for 10 minutes was applied. As between before and after this treatment, deterioration in the EUV reflectivity was 4.1%.

Example 2

Example 2 was carried out in the same procedure as in Example 1 except that the conditions for exposure to a nitrogen-containing atmosphere were changed to the following conditions.

(Exposure Conditions)
  Carrier gas: Ar gas, flow rate: 17 sccm
  Exposure gas: nitrogen gas, flow rate: 50 sccm (during RF discharge, nitrogen gas and carrier gas were supplied)
  Nitrogen gas partial pressure: 0.2 mTorr ($2.6 \times 10^{-2}$ Pa)
  Atmosphere pressure: 0.3 mTorr ($3.5$ Torr$\times 10^{-2}$ Pa)
  Atmosphere temperature: 20° C.
  Exposure time: 6,000 sec
  Exposure amount: $1.2 \times 10^6$ L (1 L (Langmuir)=$1 \times 10^{-6}$ Torr·s=$1.33 \times 10^{-4}$ Pa·s)
  Frequency of RF discharge: 1.8 MHz
  RF power: 500 W With respect to a multilayer mirror for EUVL obtained in the above procedure, the following evaluations were carried out.

(1) Film Composition

By measuring the composition in the depth direction from the surface of the protective layer 14 to the reflective layer (Mo/Si multilayer reflective film) 12 by means of an X-ray Photoelectron Spectrometer (Quantera SXM, manufactured by ULVAC-PHI, Inc.), it was confirmed that an intermediate layer 13 was formed between the protective layer 14 and the Si layer as the uppermost layer of the Mo/Si multilayer reflective film. The composition of the intermediate layer 13 was such that nitrogen was 8 at %, and Si was 92 at %. Further, the thickness of the intermediate layer 13 was 1 nm.

(2) Surface Roughness

The surface roughness of the protective layer 14 was confirmed by means of an Atomic Force Microscope (No. SPI3800, manufactured by Seiko Instruments Inc.) in accordance with JIS-B0601 (1994). The surface roughness rms of the protective layer 14 was 0.15 nm.

(3) Cleaning Durability

The surface of the protective layer 14 was treated by spin cleaning with ozone water for a total of 600 seconds. Before and after this treatment, the EUV reflectivity was measured by means of an EUV reflectivity meter by applying EUV light (wavelength: 13.5 nm) to the surface of the protective layer 14. Deterioration in the EUV reflectivity as between before and after this treatment was 0.3%.

(4) Thermal Treatment Durability

To the multilayer mirror for EUVL, thermal treatment (in the atmospheric air) at 210° C. for 10 minutes is applied. As between before and after this treatment, deterioration in the EUV reflectivity is 3.7%.

Example 3

Example 3 was carried out in the same procedure as in Example 1 except that instead of the exposure of the Si layer surface to the nitrogen-containing atmosphere (the mixed gas atmosphere of nitrogen with argon), thermal treatment was carried out under the following exposure conditions (without RF discharge).

After forming the Mo/Si multilayer reflective film, the surface of the Si layer as the uppermost layer of the Mo/Si multilayer reflective film is subjected to thermal treatment in a nitrogen-containing atmosphere (a mixed gas atmosphere of nitrogen with argon) in accordance with the following conditions without exposing it to the atmospheric air.

(Exposure Conditions)
  Atmosphere gas: Ar gas (carrier gas), flow rate: 17 sccm. Nitrogen gas, flow rate: 50 sccm
  Nitrogen gas partial pressure: 0.2 mTorr ($2.6 \times 10^{-2}$ Pa)
  Atmosphere pressure: 0.3 mTorr ($3.5 \times 10^{-2}$ Pa)
  Thermal treatment temperature: 140° C.
  Thermal treatment time: 600 sec
  Nitrogen partial pressure×thermal treatment time (exposure time to nitrogen-containing atmosphere): $1.2 \times 10^5$ L (1 L (Langmuir)=$1 \times 10^{-6}$ Torr·s=$1.33 \times 10^{-4}$ Pa·s)

With respect to a multilayer mirror for EUVL obtained in the above procedure, the following evaluations are carried out.

(1) Film Composition

By measuring the composition in the depth direction from the surface of the protective layer 14 to the reflective layer (Mo/Si multilayer reflective film) 12 by means of an X-ray Photoelectron Spectrometer (Quantera SXM, manufactured by ULVAC-PHI, Inc.), it is confirmed that an intermediate layer 13 is formed between the protective layer 14 and the Si layer as the uppermost layer of the Mo/Si multilayer reflective film. The composition of the intermediate layer 13 is such that nitrogen is 6 at %, and Si is 94 at %. Further, the thickness of the intermediate layer 13 is 1 nm.

(2) Surface Roughness

The surface roughness of the protective layer 14 is confirmed by means of an Atomic Force Microscope (No. SPI3800, manufactured by Seiko Instruments Inc.) in accordance with JIS-B0601 (1994). The surface roughness rms of the protective layer 14 is 0.15 nm.

(3) Cleaning Durability

The surface of the protective layer 14 is treated by spin cleaning with ozone water for a total of 600 seconds. Before and after this treatment, the EUV reflectivity is measured by means of an EUV reflectivity meter (MBR (trade name), manufactured by AIXUV) by applying EUV light (wavelength: 13.5 nm) to the surface of the protective layer 14. Deterioration in the EUV reflectivity as between before and after this treatment is 0.5%.

(4) Thermal Treatment Durability

To the multilayer mirror for EUVL, thermal treatment (in the atmospheric air) at 210° C. for 10 minutes is applied. As between before and after this treatment, deterioration in the EUV reflectivity is 4.3%.

Example 4

Example 4 is carried out in the same procedure as in Example 3 except that the thermal treatment conditions in the nitrogen-containing atmosphere (the mixed gas atmosphere of nitrogen with argon) are changed to the following conditions.

(Thermal Treatment Conditions)

Atmosphere gas: Ar gas (carrier gas), flow rate: 17 sccm. Nitrogen gas, flow rate: 50 sccm Nitrogen gas partial pressure: 0.2 mTorr ($2.6 \times 10^{-2}$ Pa)

Atmosphere pressure: 0.3 mTorr ($3.5 \times 10^{-2}$ Pa)

Thermal treatment temperature: 140° C.

Thermal treatment time: 6,000 sec

Nitrogen partial pressure×thermal treatment time (exposure time to nitrogen-containing atmosphere): $1.2 \times 10^6$ L (1 L (Langmuir)=$1 \times 10^{-6}$ Torr·s=$1.33 \times 10^{-4}$ Pa·s)

With respect to a multilayer mirror for EUVL obtained in the above procedure, the following evaluations are carried out.

(1) Film Composition

By measuring the composition in the depth direction from the surface of the protective layer 14 to the reflective layer (Mo/Si multilayer reflective film) 12 by means of an X-ray Photoelectron Spectrometer (Quantera SXM, manufactured by ULVAC-PHI, Inc.), it is confirmed that an intermediate layer 13 is formed between the protective layer 14 and the Si layer as the uppermost layer of the Mo/Si multilayer reflective film. The composition of the intermediate layer 13 is such that nitrogen is 8 at %, and Si is 92 at %. Further, the thickness of the intermediate layer 13 is 1 nm.

(2) Surface Roughness

The surface roughness of the protective layer 14 is confirmed by means of an Atomic Force Microscope (No. SPI3800, manufactured by Seiko Instruments Inc.) in accordance with JIS-B0601 (1994). The surface roughness rms of the protective layer 14 is 0.15 nm.

(3) Cleaning Durability

The surface of the protective layer 14 is treated by spin cleaning with ozone water for a total of 600 seconds. Before and after this treatment, the EUV reflectivity is measured by means of an EUV reflectivity meter (MBR (trade name), manufactured by AIXUV) by applying EUV light (wavelength: 13.5 nm) to the surface of the protective layer 14. Deterioration in the EUV reflectivity as between before and after this treatment is 0.3%.

(4) Thermal Treatment Durability

To the multilayer mirror for EUVL, thermal treatment (in the atmospheric air) at 210° C. for 10 minutes is applied. As between before and after this treatment, deterioration in the EUV reflectivity is 3.7%.

Comparative Example 1

Comparative Example 1 was carried out in the same procedure as in Example 1 except that after the formation of the reflective layer (Mo/Si multilayer reflective film) 12, a protective layer 14 was formed without exposing the Si layer as the uppermost layer of the Mo/Si multilayer reflective film to a nitrogen-containing atmosphere.

With respect to a multilayer mirror for EUVL obtained in the above procedure, the following evaluations were carried out.

(1) Film Composition

By measuring the composition in the depth direction from the surface of the protective layer 14 to the reflective layer (Mo/Si multilayer reflective film) 12 by means of an X-ray Photoelectron Spectrometer (Quantera SXM, manufactured by ULVAC-PHI, Inc.), formation of an intermediate layer 13 was not observed between the protective layer 14 and the Si layer as the uppermost layer of the Mo/Si multilayer reflective film, and the nitrogen content in the laminate of the Si layer and the protective layer 14 was 0%.

(2) Surface Roughness

The surface roughness of the protective layer 14 was confirmed by means of an Atomic Force Microscope (No. SPI3800, manufactured by Seiko Instruments Inc.) in accordance with JIS-B0601 (1994). The surface roughness rms of the protective layer 14 was 0.15 nm.

(3) Cleaning Durability

The surface of the protective layer 14 was treated by spin cleaning with ozone water for a total of 600 seconds. Before and after this treatment, the EUV reflectivity was measured by means of an EUV reflectivity meter by applying EUV light (wavelength: 13.5 nm) to the surface of the protective layer 14. Deterioration in the EUV reflectivity as between before and after this treatment was 2.1%.

From this result, it was confirmed that the multilayer mirror for EUVL in Comparative Example 1 was inferior in the cleaning durability as compared with the multilayer mirrors for EUVL in Examples 1 to 4.

(4) Thermal Treatment Durability

To the multilayer mirror for EUVL, thermal treatment (in the atmospheric air) at 210° C. for 10 minutes was applied. As between before and after this treatment, deterioration in the EUV reflectivity was 7.8%.

From this result, it was confirmed that the multilayer mirror for EUVL in Comparative Example 1 was inferior in the thermal treatment durability as compared with the multilayer mirrors for EUVL in Examples 1 to 4.

Comparative Example 2

Comparative Example 2 was carried out in the same procedure as in Example 1 except that the Si layer surface was exposed to an Ar gas atmosphere under the following exposure conditions instead of the nitrogen-containing atmosphere.

(Exposure Conditions)

Exposure gas: Ar gas, flow rate: 17 sccm (during RF discharge, Ar gas was supplied)

Atmosphere pressure: 0.1 mTorr ($1.3 \times 10^{-2}$ Pa)

Atmosphere temperature: 20° C.

Exposure time: 600 sec

Frequency of RF discharge: 1.8 MHz

RF power: 500 W

With respect to a multilayer mirror for EUVL obtained in the above procedure, the following evaluations were carried out.

(1) Film Composition

By measuring the composition in the depth direction from the surface of the protective layer 14 to the reflective layer (Mo/Si multilayer reflective film) 12 by means of an X-ray Photoelectron Spectrometer (Quantera SXM, manufactured by ULVAC-PHI, Inc.), formation of an intermediate layer 13 was not observed between the protective layer 14 and the Si layer as the uppermost layer of the Mo/Si multilayer reflective film, and the nitrogen content in the laminate of the Si layer and the protective layer 14 was 0%.

(2) Surface Roughness

The surface roughness of the protective layer 14 was confirmed by means of an Atomic Force Microscope (No. SPI3800, manufactured by Seiko Instruments Inc.) in accordance with JIS-B0601 (1994). The surface roughness rms of the protective layer 14 was 0.15 nm.

(3) Cleaning Durability

The surface of the protective layer 14 was treated by spin cleaning with ozone water for a total of 600 seconds. Before and after this treatment, the EUV reflectivity was measured by means of an EUV reflectivity meter by applying EUV light (wavelength: 13.5 nm) to the surface of the protective layer 14. Deterioration in the EUV reflectivity as between before and after this treatment was 2.9%.

From this result, it was confirmed that the multilayer mirror for EUVL in Comparative Example 2 was inferior in the cleaning durability as compared with the multilayer mirrors for EUVL in Examples 1 to 4.

(4) Thermal Treatment Durability

To the multilayer mirror for EUVL, thermal treatment (in the atmospheric air) at 210° C. for 10 minutes is applied. As between before and after this treatment, deterioration in the EUV reflectivity is 7.8%.

From this result, it is confirmed that the multilayer mirror for EUVL in Comparative Example 2 is inferior in the thermal treatment durability as compared with the multilayer mirrors for EUVL in Examples 1 to 4.

Comparative Example 3

Comparative Example 3 is carried out in the same procedure as in Example 1 except that without subjecting the Si layer surface to thermal treatment or RF discharge, exposure is carried out under the following exposure conditions.

After forming the Mo/Si multilayer reflective film, the surface of the Si layer as the uppermost layer of the Mo/Si multilayer reflective film is exposed to a nitrogen-containing atmosphere (a mixed gas atmosphere of nitrogen with argon) in accordance with the following conditions without exposing it to the atmospheric air.
(Exposure Conditions)
  Atmosphere gas: Ar gas (carrier gas), flow rate: 17 sccm.
    Nitrogen gas, flow rate: 50 sccm
  Nitrogen gas partial pressure: 0.2 mTorr ($2.6 \times 10^{-2}$ Pa)
  Atmosphere pressure: 0.3 mTorr ($3.5 \times 10^{-2}$ Pa)
  Thermal treatment temperature: 20° C.
  Thermal treatment time: 600 sec
With respect to a multilayer mirror for EUVL obtained in the above procedure, the following evaluations are carried out.
(1) Film Composition By measuring the composition in the depth direction from the surface of the protective layer 14 to the reflective layer (Mo/Si multilayer reflective film) 12 by means of an X-ray Photoelectron Spectrometer (Quantera SXM, manufactured by ULVAC-PHI, Inc.), formation of an intermediate layer 13 is not observed between the protective layer 14 and the Si layer as the uppermost layer of the Mo/Si multilayer reflective film, and the nitrogen content in the laminate of the Si layer and the protective layer 14 is 0.2%.
(2) Surface Roughness The surface roughness of the protective layer 14 is confirmed by means of an Atomic Force Microscope (No. SPI3800, manufactured by Seiko Instruments Inc.) in accordance with JIS-B0601 (1994). The surface roughness rms of the protective layer 14 is 0.15 nm.
(3) Cleaning Durability The surface of the protective layer 14 is treated by spin cleaning with ozone water for a total of 600 seconds. Before and after this treatment, the EUV reflectivity is measured by means of an EUV reflectivity meter (MBR (trade name), manufactured by AIXUV) by applying EUV light (wavelength: 13.5 nm) to the surface of the protective layer 14. Deterioration in the EUV reflectivity as between before and after this treatment is 1.9%. From this result, it is confirmed that the multilayer mirror for EUVL in Comparative Example 3 is inferior in the cleaning durability as compared with the multilayer mirrors for EUVL in Examples 1 to 4.

(4) Thermal Treatment Durability

To the multilayer mirror for EUVL, thermal treatment (in the atmospheric air) at 210° C. for 10 minutes is applied. As between before and after this treatment, deterioration in the EUV reflectivity is 7.4%.

From this result, it is confirmed that the multilayer mirror for EUVL in Comparative Example 3 is inferior in the thermal treatment durability as compared with the multilayer mirrors for EUVL in Examples 1 to 4.

Comparative Example 4

Comparative Example 4 was carried out in the same procedure as in Example 3 except that instead of the thermal treatment of the Si layer surface in the nitrogen-containing atmosphere, the thermal treatment was carried out in an Ar gas atmosphere in accordance with the following conditions.
(Thermal Treatment Conditions)
  Atmosphere gas: Ar gas, flow rate: 17 sccm
  Atmosphere pressure: 0.1 mTorr ($1.3 \times 10^{-2}$ Pa)
  Thermal treatment temperature: 140° C.
  Thermal treatment time: 600 sec
With respect to a multilayer mirror for EUVL obtained in the above procedure, the following evaluations are carried out.
(1) Film Composition By measuring the composition in the depth direction from the surface of the protective layer 14 to the reflective layer (Mo/Si multilayer reflective film) 12 by means of an X-ray Photoelectron Spectrometer (Quantera SXM, manufactured by ULVAC-PHI, Inc.), formation of an intermediate layer 13 is not observed between the protective layer 14 and the Si layer as the uppermost layer of the Mo/Si multilayer reflective film, and the nitrogen content in the laminate of the Si layer and the protective layer 14 is 0%.
(2) Surface Roughness The surface roughness of the protective layer 14 is confirmed by means of an Atomic Force Microscope (No. SPI3800, manufactured by Seiko Instruments Inc.) in accordance with JIS-B0601 (1994). The surface roughness rms of the protective layer 14 is 0.15 nm.
(3) Cleaning Durability The surface of the protective layer 14 is treated by spin cleaning with ozone water for a total of 600 seconds. Before and after this treatment, the EUV reflectivity is measured by means of an EUV reflectivity meter (MBR (trade name), manufactured by AIXUV) by applying EUV light (wavelength: 13.5 nm) to the surface of the protective layer 14. Deterioration in the EUV reflectivity as between before and after this treatment is 2.9%. From this result, it is confirmed that the multilayer mirror for EUVL in Comparative Example 4 is inferior in the cleaning durability as compared with the multilayer mirrors for EUVL in Examples 1 to 4.
(4) Thermal Treatment Durability To the multilayer mirror for EUVL, thermal treatment (in the atmospheric air) at 210° C. for 10 minutes is applied. As between before and after this treatment, deterioration in the EUV reflectivity is 7.8%.

From this result, it is confirmed that the multilayer mirror for EUVL in Comparative Example 4 is inferior in the thermal treatment durability as compared with the multilayer mirrors for EUVL in Examples 1 to 4.

Comparative Example 5

Comparative Example 5 is carried out in the same procedure as in Example 3 except that the Si layer surface is exposed to the atmospheric air before thermally treating it in the nitrogen-containing atmosphere (the mixed gas atmosphere of nitrogen with argon).
(Conditions for Exposure to Atmospheric Air)
  Exposure gas: atmospheric air ($N_2$: about 78 vol %, $O_2$: about 21 vol %)
  Atmosphere pressure: 760 Torr ($1.0 \times 10^5$ Pa)
  Atmosphere temperature: 20° C.
  Exposure time: 600 sec
(Thermal Treatment Conditions)
  Atmosphere gas: Ar gas (carrier gas), flow rate: 17 sccm. Nitrogen gas, flow rate: 50 sccm
  Nitrogen gas partial pressure: 0.2 mTorr ($2.6 \times 10^{-2}$ Pa)
  Atmosphere pressure: 0.3 mTorr ($3.5 \times 10^{-2}$ Pa)
  Thermal treatment temperature: 140° C.
  Thermal treatment time: 600 sec
  Nitrogen partial pressure×thermal treatment time (exposure time to nitrogen-containing atmosphere): $1.2 \times 10^6$ L (1 L (Langmuir)=$1 \times 10^{-6}$ Torr·s=$1.33 \times 10^{-4}$ Pa·s)

With respect to a multilayer mirror for EUVL obtained in the above procedure, the following evaluations are carried out.

(1) Film Composition

By measuring the composition in the depth direction from the surface of the protective layer 14 to the reflective layer (Mo/Si multilayer reflective film) 12 by means of an X-ray Photoelectron Spectrometer (Quantera SXM, manufactured by ULVAC-PHI, Inc.), it is confirmed that an intermediate layer 13 is formed between the protective layer 14 and the Si layer as the uppermost layer of the Mo/Si multilayer reflective film. The composition of the intermediate layer 13 is such that oxygen is 4 at %, nitrogen is 1 at % and Si is 95 at %. Further, the thickness of the intermediate layer 13 is 1 nm.

(2) Surface Roughness

The surface roughness of the protective layer 14 is confirmed by means of an Atomic Force Microscope (No. SPI3800, manufactured by Seiko Instruments Inc.) in accordance with JIS-B0601 (1994). The surface roughness rms of the protective layer 14 is 0.15 nm.

(3) Cleaning Durability

The surface of the protective layer 14 is treated by spin cleaning with ozone water for a total of 600 seconds. Before and after this treatment, the EUV reflectivity is measured by means of an EUV reflectivity meter (MBR (trade name), manufactured by AIXUV) by applying EUV light (wavelength: 13.5 nm) to the surface of the protective layer 14. Deterioration in the EUV reflectivity as between before and after this treatment is 0.8%. From this result, it is confirmed that the multilayer mirror for EUVL in Comparative Example 5 is inferior in the cleaning durability as compared with the multilayer mirrors for EUVL in Examples 1 to 4, although its cleaning durability is improved as compared with Comparative Example 1.

(4) Thermal Treatment Durability

To the multilayer mirror for EUVL, thermal treatment (in the atmospheric air) at 210° C. for 10 minutes is applied. As between before and after this treatment, deterioration in the EUV reflectivity is 8.1%.

From this result, it is confirmed that the multilayer mirror for EUVL in Comparative Example 5 is inferior in the thermal treatment durability as compared with the multilayer mirrors for EUVL in Examples 1 to 4.

Example 5

Example 5 was carried out in the same procedure as in Example 1 except that at the time of exposing the Si layer as the uppermost layer of the Mo/Si multilayer reflective film to the nitrogen-containing atmosphere (the mixed gas atmosphere of nitrogen with argon), no RF discharge was carried out, and the Si layer surface was irradiated with ultraviolet rays in accordance with the following conditions.
(Exposure Conditions)
  Carrier gas: Ar gas, flow rate: 17 sccm
  Exposure gas: nitrogen gas, flow rate: 50 sccm
  Nitrogen gas partial pressure: 0.2 mTorr ($2.6 \times 10^{-2}$ Pa)
  Atmosphere pressure: 0.3 mTorr ($3.5 \times 10^{-2}$ Pa)
  Atmosphere temperature: 20° C.
  Exposure time: 600 sec
  Exposure amount: $1.2 \times 10^6$ L (1 L (Langmuir)=$1 \times 10^{-6}$ Torr·s=$1.33 \times 10^{-4}$ Pa·s)
  Ultraviolet irradiation power source: argon excimer lamp
  Ultraviolet wavelength: 126 nm
  Distance between lamp window (magnesium fluoride) to substrate: 5 cm With respect to a multilayer mirror for EUVL obtained in the above procedure, the following evaluations were carried out.

(1) Film Composition

By measuring the composition in the depth direction from the surface of the protective layer 14 to the reflective layer (Mo/Si multilayer reflective film) 12 by means of an X-ray Photoelectron Spectrometer (Quantera SXM, manufactured by ULVAC-PHI, Inc.), it was confirmed that an intermediate layer 13 was formed between the protective layer 14 and the Si layer as the uppermost layer of the Mo/Si multilayer reflective film. The composition of the intermediate layer 13 was such that nitrogen was 8 at %, and Si was 92 at %. Further, the thickness of the intermediate layer 13 was 1 nm.

(2) Surface Roughness

The surface roughness of the protective layer 14 was confirmed by means of an Atomic Force Microscope (No. SPI3800, manufactured by Seiko Instruments Inc.) in accordance with JIS-B0601 (1994). The surface roughness rms of the protective layer 14 was 0.15 nm.

(3) Cleaning Durability

The surface of the protective layer 14 was treated by spin cleaning with ozone water for a total of 600 seconds. Before and after this treatment, the EUV reflectivity was measured by means of an EUV reflectivity meter (MBR (trade name), manufactured by AIXUV) by applying EUV light (wavelength: 13.5 nm) to the surface of the protective layer 14. Deterioration in the EUV reflectivity as between before and after this treatment was 0.3%.

(4) Thermal Treatment Durability

To the multilayer mirror for EUVL, thermal treatment (in the atmospheric air) at 210° C. for 10 minutes is applied. As between before and after this treatment, deterioration in the EUV reflectivity is 3.7%.

INDUSTRIAL APPLICABILITY

The multilayer mirror for EUV lithography of the present invention can be effectively used for the production of a semiconductor integrated circuit since deterioration in the EUV reflectivity is prevented. Particularly, it is thereby possible to produce a semiconductor integrated circuit having a fine pattern with high production efficiency.

This application is a continuation of PCT Application No. PCT/JP2010/072169, filed Dec. 9, 2010, which is based upon and claims the benefit of priorities from Japanese Patent Application No. 2009-279371 filed on Dec. 9, 2009, Japanese Patent Application No. 2009-294310 filed on Dec. 25, 2009, Japanese Patent Application No. 2010-021944 filed on Feb. 3, 2010, Japanese Patent Application No. 2010-067421 filed on Mar. 24, 2010 and Japanese Patent Application No. 2010-134822 filed on Jun. 14, 2010. The contents of those applications are incorporated herein by reference in its entirety.

REFERENCE SYMBOLS

1: Multilayer mirror for EUVL
11: Substrate
12: Reflective layer
13: Intermediate layer
14: Protective layer

What is claimed is:

1. A multilayer mirror for EUV lithography comprising a substrate, and a reflective layer for reflecting EUV light and a protective layer for protecting the reflective layer, formed in this order on the substrate, wherein
the reflective layer is a Mo/Si multilayer reflective film,
the protective layer is a Ru layer or a Ru compound layer, and
an intermediate layer containing from 0.5 to 25 at % of nitrogen and from 75 to 99.5 at % of Si is formed between the reflective layer and the protective layer.

2. The multilayer mirror for EUV lithography according to claim 1, wherein the uppermost layer of the reflective layer made of a Mo/Si multilayer reflective film is a Si film, and the intermediate layer is formed in contact with the Si film.

3. The multilayer mirror for EUV lithography according to claim 1, wherein the thickness of the intermediate layer is from 0.2 to 2.5 nm.

4. The multilayer mirror for EUV lithography according to claim 1, wherein the surface roughness rms of the surface of the protective layer is at most 0.5 nm.

5. The multilayer mirror for EUV lithography according to claim 1, wherein the thickness of the protective layer is from 1 to 10 nm.

6. A process for producing a multilayer mirror for EUV lithography (EUVL), which comprises forming a multilayer reflective film for reflecting EUV light on a film-forming surface of a substrate and then, forming a protective layer for protecting the multilayer reflective film, on the multilayer reflective film, to produce a multilayer mirror for EUVL, wherein
the multilayer reflective film is a Mo/Si multilayer reflective film,
the protective layer is a Ru layer or a Ru compound layer, and
after forming the Mo/Si multilayer reflective film, the surface of a Si layer as the uppermost layer of the Mo/Si multilayer reflective film is exposed to a nitrogen-containing atmosphere without exposing it to the atmospheric air, and then, the protective layer is formed.

7. The process for producing a multilayer mirror for EUVL according to claim 6, wherein the product of the nitrogen partial pressure (Torr) of the nitrogen-containing atmosphere and the exposure time (s) is at least $1\times10^{-6}$ Torr·s, and the temperature of the nitrogen-containing atmosphere is from 0 to 170° C.

8. The process for producing a multilayer mirror for EUVL according to claim 6, wherein the product of the nitrogen partial pressure (Torr) of the nitrogen-containing atmosphere and the exposure time (s) is at least $1\times10^{-6}$ Torr·s, and the temperature of the nitrogen-containing atmosphere is from 0 to 160° C.

9. The process for producing a multilayer mirror for EUVL according to claim 6, wherein the product of the nitrogen partial pressure (Torr) of the nitrogen-containing atmosphere and the exposure time (s) is at least $1\times10^{-6}$ Torr·s, and the temperature of the nitrogen-containing atmosphere is from 0 to 150° C.

10. The process for producing a multilayer mirror for EUVL according to claim 6, wherein when the surface of the Si layer is exposed to the nitrogen-containing atmosphere, the nitrogen-containing atmosphere is maintained to be in a plasma state, or the surface of the Si layer is subjected to thermal treatment, or the surface of the Si layer is irradiated with ultraviolet rays.

11. A process for producing a semiconductor integrated circuit, which comprises subjecting an object to be exposed to exposure by means of the multilayer mirror for EUV lithography as defined in any one of claims 1 to 5, to produce a semiconductor integrated circuit.

* * * * *